United States Patent
Agarwal et al.

(12)
(10) Patent No.: US 6,864,712 B2
(45) Date of Patent: Mar. 8, 2005

(54) HARDENING LOGIC DEVICES

(75) Inventors: Deepak Agarwal, Marlow Bucks (GB); Parvesh Swami, New Delhi (IN)

(73) Assignee: STMicroelectronics Limited (GB)

( * ) Notice: Subject to any disclaimer, the term of this patent is extended or adjusted under 35 U.S.C. 154(b) by 0 days.

(21) Appl. No.: 10/426,248

(22) Filed: Apr. 28, 2003

(65) Prior Publication Data

US 2004/0212394 A1 Oct. 28, 2004

(51) Int. Cl.$^7$ ............................................. H03K 19/177
(52) U.S. Cl. ............................. 326/41; 326/38; 326/47; 326/16; 326/101
(58) Field of Search ............................. 326/38–41, 47, 326/101, 16; 716/2, 16, 17; 714/724–726; 365/154, 156, 189.05; 257/296

(56) References Cited

U.S. PATENT DOCUMENTS 5,587,921 A  * 12/1996 Agrawal et al. ............... 716/16
5,805,496 A  *  9/1998 Batson et al. ................. 365/154
5,818,750 A  * 10/1998 Manning ...................... 365/154
6,301,696 B1    10/2001 Lien et al.

* cited by examiner

Primary Examiner—Vibol Tan
(74) Attorney, Agent, or Firm—Jenkens & Gilchrist, P.C.

(57) ABSTRACT

The present invention is concerned with a method and apparatus for hardening logic devices. The logic device has a plurality of memory cells forming an array connected by data lines and clock lines, and the device having a further connecting line. The method comprising: receiving data on said data lines for configuring each of the memory cells. Storing data in each of the memory cells by enabling at least one of the clock lines and when the desired data has been stored, hardening the array to fix the data by selectively connecting the data and clock lines to the further line.

23 Claims, 7 Drawing Sheets

HARDENING LOGIC DEVICES

FIELD OF THE INVENTION

The present invention is concerned with a method for making logic devices comprising a plurality of memory cells, and in particular, but not exclusively with FPGA (Field Programmable Gate Array) logic devices.

BACKGROUND OF INVENTION

FPGAs are semi-custom devices, which contain a fixed set of gate structures that may be interconnected in a number of ways to achieve a desired logic function. In FPGA's the interconnect pattern is programmed electrically by the user. That is, in commercial applications or in rapid prototyping, FPGA's are useful since these devices can be purchased off the shelf and are flexible enough to be programmed and reprogrammed allowing the system designer to configure the circuit as desired.

FPGAs generally include an array of PLB's (Programmable Logic Blocks). A PLB can be referred to by various names such as a CLB (Configurable Logic Block), a CLE (Configurable Logic Element) or a PFU (Programmable Function Unit). Each PLB is a small programmable logic block which often includes one or more input lines, one or more output lines, one or more latches and one or more LUT's (Look Up Tables).

The LUT can be programmed to perform various functions, for example: general combinatorial logic, control logic or to set up the data path (i.e. interconnect pattern) between the input and output lines.

In this manner, the LUT can determine whether each respective PLB performs general logic, or has a special mode of operation such as an adder, a subtractor, a counter or a register. The actual functionality for each PLB is basically decided by configuration values stored in SRAM memory cells (i.e. latches) for the LUT as well as to make the connections.

These SRAM memory cells are volatile in nature and thereby provide the reconfiguration flexibility desired from a PLB. Using this flexibility, a number of iterations for design purposes can be tried with FPGA devices to eventually achieve the desired specifications of the system. This technique is especially useful for prototyping a new design or product during the development and debugging stages, since the re-programmable nature of the FPGA significantly reduces development and manufacturing costs and time.

On the other hand, an ASIC (Application Specific Integrated circuit) is a less flexible device designed and manufactured to perform a specific function, and requires a relatively large amount of engineering man hours and cost to develop.

Since an FPGA is a flexible and programmable device, it is volatile in nature and requires a large amount of additional circuitry and arrangement for programming, re-programming and storing the information for reprogramming. This additional circuitry is required, for example, when reprogramming the FPGA with different information such as in the prototyping/debugging stages for a product, but has no use once configuration information has been finalized which meets the desired system specifications.

In particular, the additional circuitry increases the total area and complexity of the device if implemented for example on a system board, and increases the amount of silicon used by the FPGA and its additional circuitry when integrated with some ASIC for a PSOC (Programmable System-On-Chip).

ASIC's do not require the additional circuitry and arrangements. Therefore, in the past once a specific configuration has been tested and finalized using programmable logic (i.e. an FPGA), it is then useful to make the system from an ASIC instead of a FPGA. Although the desired configuration of the device will have been finalised, it is still necessary to redesign and manufacture the ASIC to be equivalent to the FPGA, which entails a complex, time consuming and expensive process.

Therefore, once a specific configuration of a programmable logic device is tested and finalized for a system, there is a need to replace the programmable Logic (FPGA) with a hardened circuit, equivalent to an ASIC, which does not have the drawbacks of the additional circuitry of programmable logic or the drain on resources of having to manufacture an ASIC to suit such a purpose.

U.S. Pat No. 6,301,696 describes a method for making an integrated circuit which includes an initial design of an FPGA that can be programmed to implement a desired function and then selecting a specific configuration by hardening the FPGA. This process of hardening is used for increasing the speed of the FPGA by bypassing the on-state resistance of selected transistors with fast metal connections.

SUMMARY OF INVENTION

According to a first aspect of the present invention there is provided a method of configuring a logic device having a plurality of memory cells connected by data lines and clock lines to form an array, the device having a further connecting line, the method comprising: receiving data on said data lines for storing in each of the memory cells; storing data in each of the memory cells by selectively enabling the clock lines; testing the logic device until it is decided to store certain data in the memory cells; hardening the array to fix the certain data in said memory cells; and permanently connecting the clock lines to the further connecting line, whereby all clock lines are selectable together after the logic device has been configured.

According to a further aspect of the present invention there is provided a method of manufacturing and configuring a logic device having a plurality of memory cells connected by data lines and clock lines to form an array, the method comprising: forming a further connecting line in a space reserved during manufacture of the device; hardening the array to fix certain tested data in said memory cells; and permanently connecting the clock lines to the further connecting line, whereby all clock lines are selectable together.

According to yet a further aspect of the present invention there is provided a logic device having a plurality of memory cells forming an array, each memory cell comprising: a data line for transferring data through a pass element to a storage device arranged to store the data; a clock line for enabling the pass element; a further connecting line formed independently of said clock lines; and wherein said data is fixedly stored in the memory devices and whereby the clock lines are permanently connected to said further line so that the clock lines are selectable together.

According to yet a further aspect of the present invention there is provided a method of configuring a logic device having a plurality of memory cells forming an array connected by data lines and clock lines, the memory cells having a latch for storing data, a transistor and supply and reference voltages, the device having a further line, the method comprising: connecting the latch of each memory cell through said transistor to one of said supply and reference voltages; setting each latch to store data corresponding to one of said voltages by enabling said transistors using a common control signal; and when desired data is stored in the latches of said memory cells, hardening the array to fix the data by permanently connecting the clock lines to the further line.

According to yet another aspect of the present invention there is provided a logic device having a plurality of memory cells forming an array, each memory cell comprising: a data line for transferring data through a pass element to a latch arranged to store the data; a clock line for enabling the pass element; a transistor connected between said latch and one of a supply voltage and a reference voltage, the transistor being enabled by a control line; and a further line wherein said data is fixedly stored in the memory cells by connecting said clock line to said the further line.

DESCRIPTION OF DRAWINGS

Embodiments of the present invention will now be described by way of example only with reference to the accompanying drawings, in which.

DETAILED DESCRIPTION OF THE INVENTION

Figure 1:
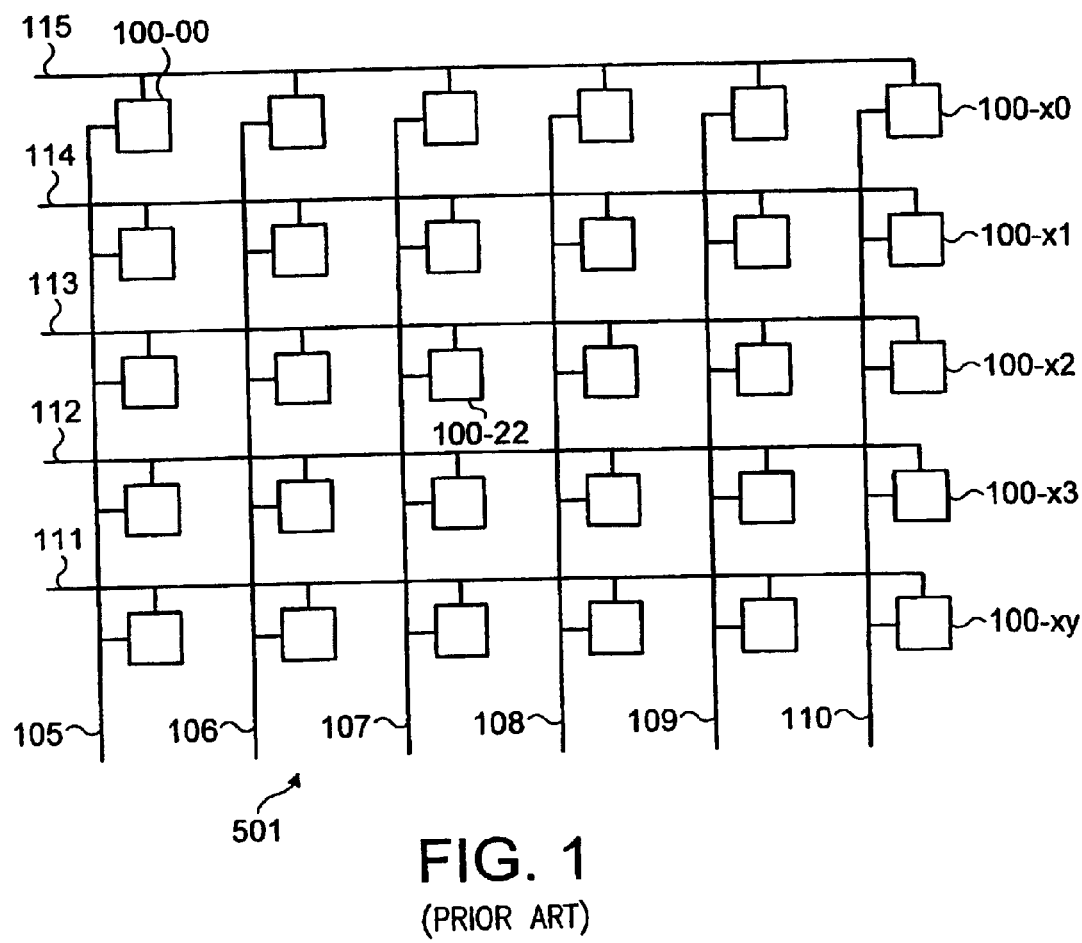
FIG. 1 shows a structure of a memory cell array structure in a conventional FPGA and with which embodiments of the present invention can be used.

The configurable memory cells of a PLD are typically arranged in an array and loaded using serial bit streams of configuration data. FIG. 1 illustrates such a known memory array configuration. The configuration memory array 501 comprises memory cells 100-xy where x and y correspond to the column and row number respectively. In the embodiment, the array 501 is shown to comprise an array of memory cells comprising five rows and six columns. However it should be appreciated that x and y could be bigger than five rows and six columns, and that the array could be of any desired size. Each row of memory cells is connected to a corresponding common clock line 111–115 and each column of memory cells is connected to a corresponding common data line 105–110.

In a preferred embodiment, the configuring of data into the memory array is achieved by shifting a bit stream of configuration data through a horizontal shift register (not shown) connected to the inputs of the vertical data lines 105–110, until a frame of data which is six bits wide is created for each of the data lines of the array. That is, the horizontal shift register operates to shift a desired bit sequence serially to the inputs of the data lines 105–110 and once a desired frame of configurations bits has been created, these bits can then be shifted out in parallel onto the vertical data lines 105 to 110.

The desired horizontal frame of configuration bits can then be selectively shifted into one of the rows of memory cells by using a vertical shift register (not shown). The vertical shift register is connected to the inputs of the horizontal common data lines 111–115 and operates in much the same way as the horizontal shift register. That is, the vertical shift register operates to shift a desired bit sequence thereby creating a vertical frame of enabling bits. The frame of enabling bits can then be shifted out in parallel to the inputs of the clock lines 111–115 for selectively determining which of the rows of memory cells will actually receive the frame of configuration bits from the horizontal shift register.

A particular row of memory cells is addressed by shifting an enabling bit (i.e. high or low bit depending on whether positive or negative logic is used) to one of the selected horizontal lines 111–115 via the vertical shift register. In a preferred embodiment the shift registers are formed from flip-flops, which use one shift per frame. The loading of data is therefore performed in a Serial In Parallel Out (SIPO) mode.

It is possible for a row of memory cells, for example the first row comprising the memory cells 100-00 to 100-x0, to be loaded at the same time using their respective data lines 105 to 110 and by enabling their common clock line 115 by setting the corresponding enabling bit. Also, all of the rows can be loaded simultaneously by shifting the enabling bits in parallel to the corresponding clock lines. However, in an alternative embodiment, each row of memory cells will be loaded by enabling their respective clock line 111–115 one at a time in a serially fashion rather than simultaneously. The system is flexible and allows either the serial or simultaneous embodiments to be used depending on the application. For example, data will be loaded serially during configuration of the memory cell, but will be loaded simultaneously in other applications, for example in the case of a latch clear or an initialisation operation where the same data is to be written.

Figure 2:
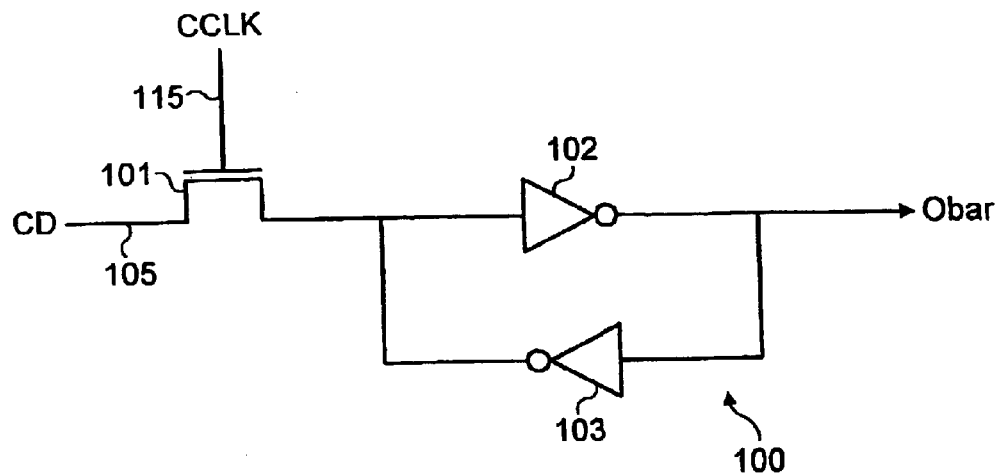
FIG. 2 shows a first embodiment of an FPGA SRAM cell used to store configuration information.

FIG. 2 shows the circuit diagram of the single memory cell 100-00. The memory cell consists of a latch formed by two back-to-back inverters 102 and 103 that store a bit value passed by the pass transistor 101. During configuration, if the enabling bit on the common clock line 115 is selected then the pass transistor 101 is enabled and the information present on the data line 105 is stored in the data latch 102, 103 of the memory cell 100-00.

Figure 3:
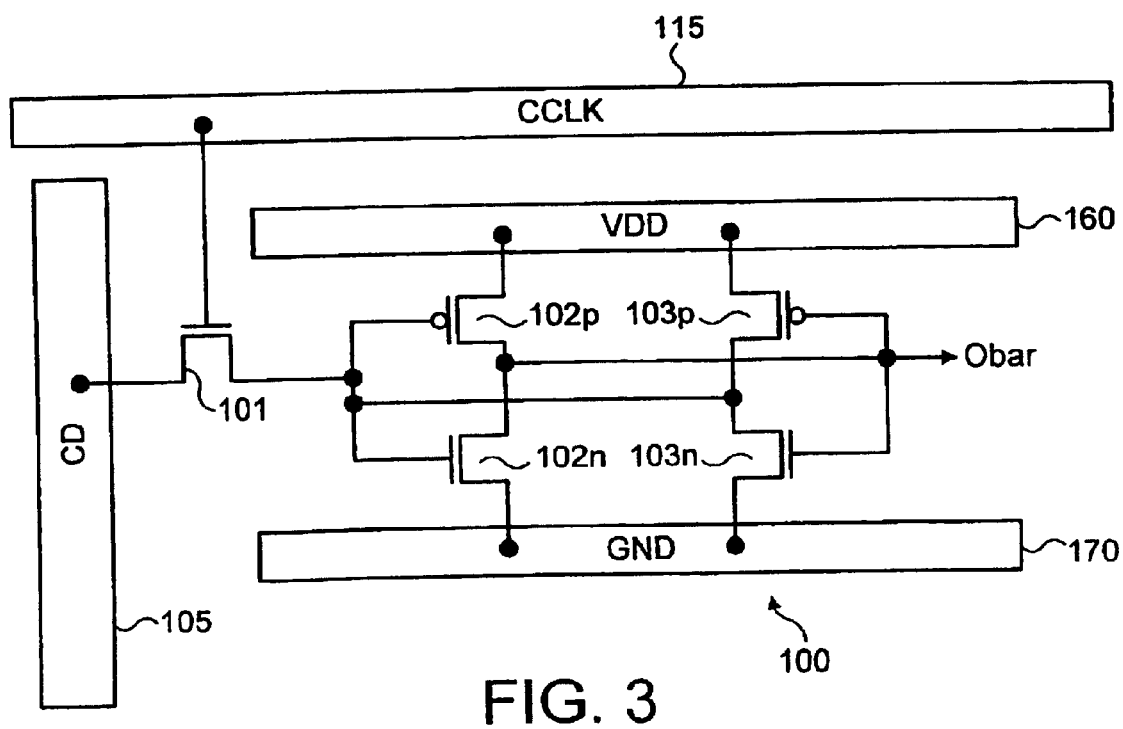
FIG. 3 shows a first embodiment of physical template structure of the SRAM memory cell.

FIG. 3 shows an embodiment of the physical template of memory cell 100-00, in which the various lines built up during manufacture can be constructed from different metal layers as will be explained further below. The terminology "metal layer N" will be used herein to mean that the line is question is formed in a particular metal layer during manufacturing. Therefore, metal layers N+1 or N−1 indicate that a metal layer is formed above or below metal layer N or at least is not formed from the same metal as layer N.

The common clock line 115 is formed in metal layer N and controls whether the pass transistor 101 is enabled. Also, the common data line 105 in metal layer N+1 (or N−1) carries the configuration data for memory cell 100.

Moreover, power rails can be formed from metal layer N, so that a supply power rail 160 is connected to PMOS transistors 102p, 103p (which forms part of the inverters 102, 103) and ground rail 170 also formed from metal line N is connected with the respective NMOS transistors 102n, 103n (which make up the inverters 102, 103). It should be appreciated that in the actual manufacturing process, although the same metal line or layer N may be used, the supply 160 and ground rails 170 are not connected.

To build the array of memory cells shown in FIG. 1, the data line of each cell will be connected to the data line of another cell in the same row to form the common data line 105. Also, the clock line of each cell will be connected to the clock line of another cell in the same column to form the common clock line 115. Also, the supply power rails and ground rails of each memory cell can be connected with corresponding power and ground rails of other memory cells to form the common supply power rail 160 and the common ground rail 170.

Figure 4:
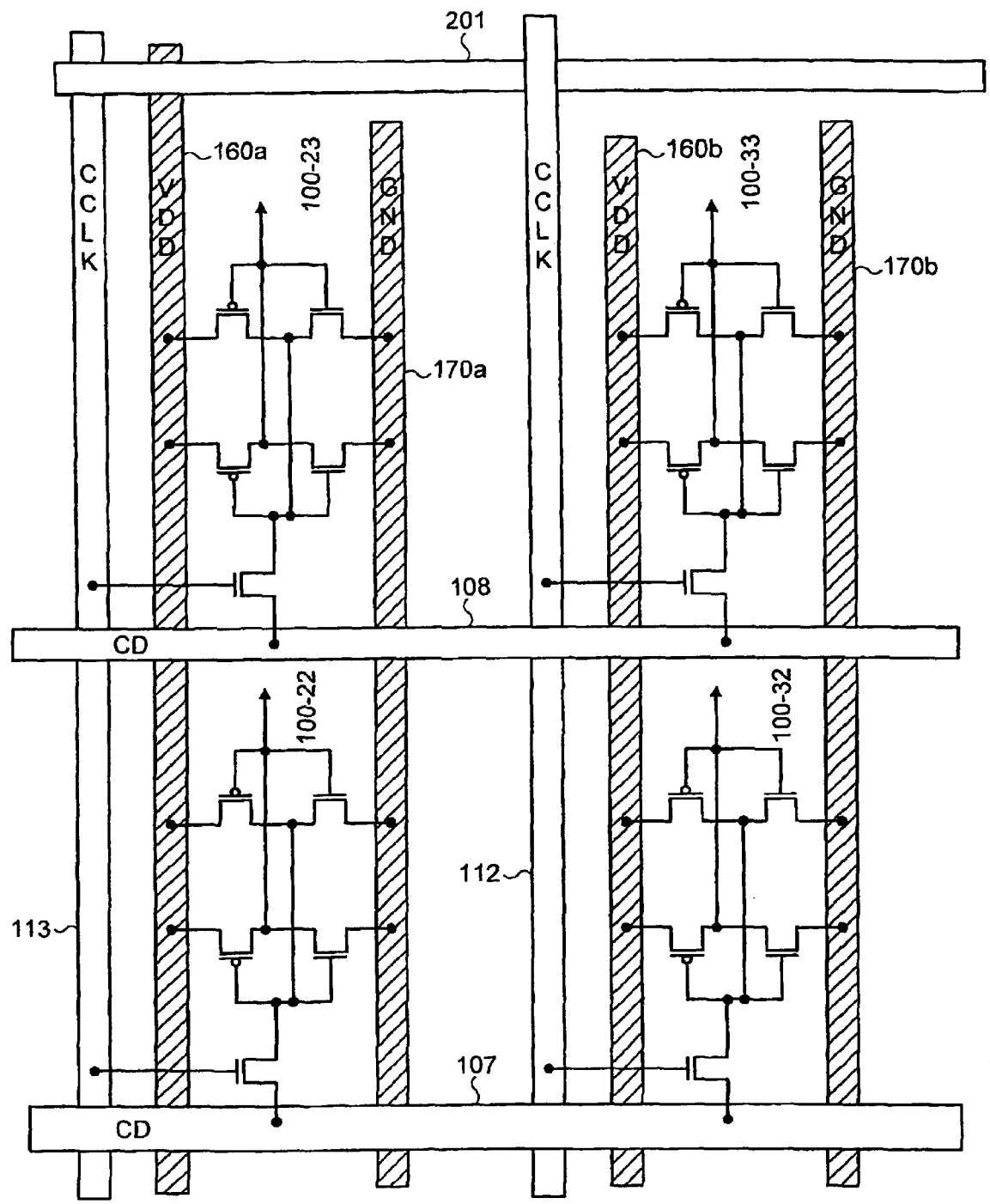
FIG. 4 shows an SRAM cell array representing a step in manufacturing the hardened logic device according to a first embodiment of the invention.

FIG. 4 shows an embodiment of the physical template of a 2×2 memory cell array. It should be appreciated that a 2×2 memory cell array is shown for simplification purposes and that the principle of the embodiment can be applied to a bigger array (i.e. from 100-00 to 100-xy). However, for the purposes of explanation consider the block of the memory array 501 shown in FIG. 1 comprising the four memory cells 100-22, 100-23, 100-32 & 100-33.

The memory cells 100-22 and 100-23 are connected in a first row and therefore are supplied by the common clock line 113 in metal layer N. Also, the memory cells 100-32 and 100-33 are connected in a second row and therefore are supplied by the common clock line 112 in metal layer N. By connecting these two rows an array is made using the two common data lines 107, 108.

That is, data line 107 in metal layer N+1 (or N−1) is common to the column of memory cells 100–22, 100–32 and data line 108 in metal N+1 (or N−1) is common to the column of memory cells 100-23, 100-33.

During normal configuration of the FPGA, in a first cycle the common clock line 113 will be high to turn on the pass transistors for each of the associated memory cells 100-22, 100-23 and the data configuration bits are then transferred to these memory cells 100-22, 100-23 using data lines 107 and 108. In the second cycle, the common clock line 112 will be high to turn on the pass transistors for each of the associated memory cells 100-32, 100-33 and the data will then be transferred to these memory cells 100-32, 100-33 using the common data lines 107 and 108 respectively.

During configuration only one configuration clock line will be high at any instant in time so that data available on data lines will be loaded into the respective memory row for which the configuration clock line is high.

During manufacturing of the FPGA, an extra metal line 201 in metal layer N+1 (or N−1) is designed in parallel to the other common data lines in such a manner to cross all the common clock lines. Thus, a space is reserved for metal line 201 during the manufacture of the FPGA, which is useful during the manufacture of the hardened FPGA as will be seen in relation to FIG. 5.

The embodiments described herein reflect that the common clock lines are formed in metal layer N while the common data lines and the extra metal line are formed in metal layers N+1 (or N−1). That is, the respective data, clock and extra metal line are formed in different metal layers. However, it should be appreciated that in alternative embodiments the respective lines can all be formed in the same metal layer albeit that they are separated electrically from one another.

Figure 5:
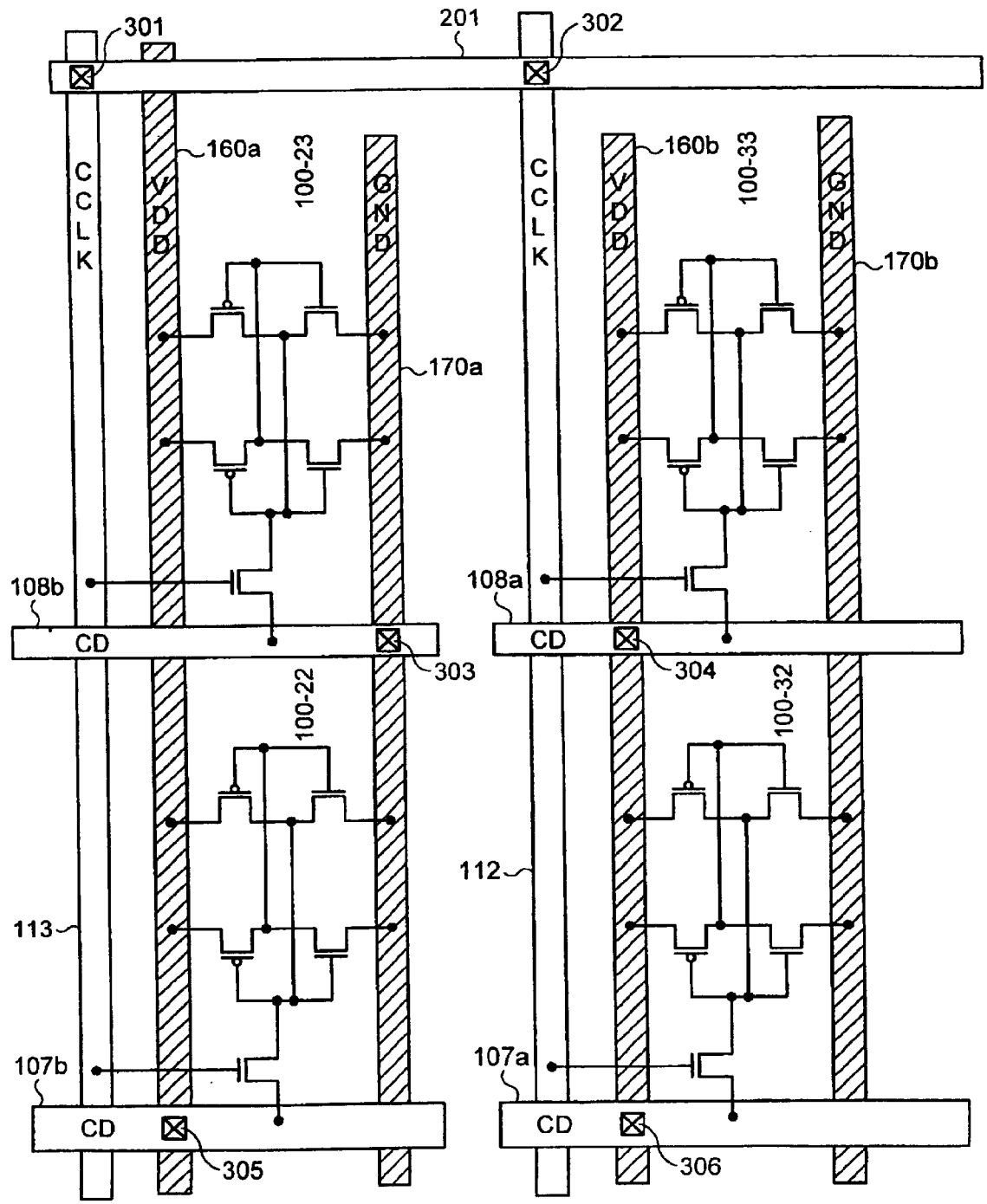
FIG. 5 shows an SRAM cell array of the hardened logic device after configuration according to a first embodiment of the invention.

FIG. 5 shows an embodiment of the present invention for hardening the FPGA of the programmable memory cell array shown in FIG. 4. That is, once a specific set of configuration data bits is finalized for the array and tested with the normal FPGA then this configuration needs to be fixed by hardening the FPGA to achieve the same functionality without the additional circuitry required in the past.

During configuration and testing data is shifted into and out of the memory cells until such time as the desired functionality of the FPGA is achieved. That is, the data stored in the memory cells is tested at particular instants to finalise a certain data configuration. Once a certain data configuration is tested which exhibits the necessary characteristics, the certain data is fixed by hardening the memory cell array.

In the specific example of the 2×2 memory cell array, consider that a specific configuration has been finalised so that the memory cells 100-22, 100-32, 100-33 are all configured to store the value "1" or "High", whereas the memory cell 100-23 is configured for value "0" or "low".

To harden this configuration information, the common data lines 107, 108 in metal layers N+1 (or N−1) are split into two parts 107a, 107b and 108a, 108b respectively to provide an independent data line for each memory cell. Depending on the required configuration data, these independent data lines 107a, 107b, 108a, 108b in metal layers N+1 (or N−1) can be connected to either the common supply power rail VDD 160a, 160b or the ground rail GND on 170a, 170b lines to store the values of "1" or "0" as required by the respective data configuration bits.

In one embodiment the connections of the independent common data lines to the relevant common power rails can be done using a "via" plane. That is, a first via 303 is used to connect independent data line 108b in metal layer N+1 (or N−1) to the GND line 170a in metal layer N, which provides the desired "low" or "0" value to be stored in the memory cell 100-23.

A second via 305 is used to connect the data line 107b in metal layer N+1 (or N−1) to the VDD line 160a in metal layer N, which provides the desired "high" or "1" value to be stored in the memory cell 100-22. Also, third and fourth vias 306 and 304 are used to connect the data lines 107a and 108a to the VDD line 160b, which also provides the desired "high" or "1" values to be stored in the memory cells 100-32 and 100-33 respectively.

Moreover, the pass transistors of each memory cell will need to be enabled for the configuration values on the respective data lines to be loaded in a hardened form into the memory cells. According to a preferred embodiment, to turn on the pass transistors, the common clock lines 113, 112 in metal layer N are connected with each other using metal line 201 formed in metal layer N+1 (or N−1) and the vias 301, 302. In an alternative embodiment the common clock lines and the extra line are formed in the same metal layer, in which case a via is not required to make the connection. Now all clock lines are connected with each other and can be turned on or off at the same time.

According to another embodiment, the pass transistors can be turned on permanently by connecting the common clock lines 113, 112 to the VDD line 160a using an additional via (not shown). That is, the additional via is located on the metal line 201 to connect with the VDD line 160a, which results in all of the common clock lines being held high. Therefore, the pass transistors of all of the memory cells are permanently on so as to load the memory cells with the configuration data available on data lines 107a, 107b, 108a, 108b in hard form.

To summarise, in the first embodiment shown in FIG. 5, the common clock lines will not be connected with the VCC line and the metal line 201 will be controlled externally. In the second embodiment, a via is used to connect the metal line (and hence the common clock lines) with the VCC line allowing the input pass transistors to be turned on permanently requiring no external control.

Figure 6:
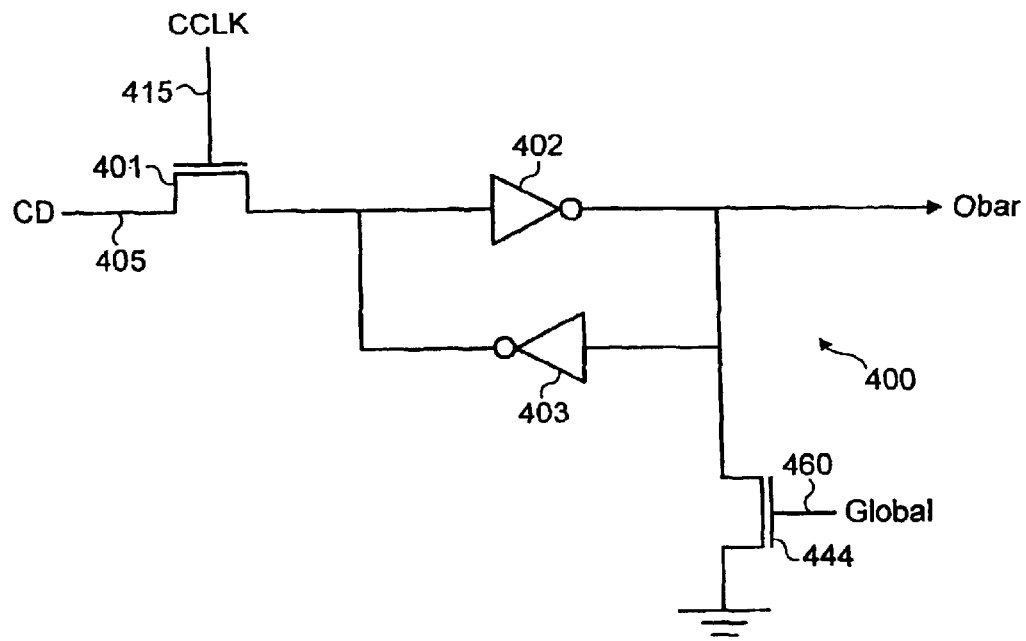
FIG. 6 shows a second type of an FPGA SRAM cell used to store configuration information.

FIG. 6 shows a circuit diagram of another type of memory cell. The memory is similar to the embodiment shown in FIG. 1, except memory cell 400 also has one more transistor 444 connected to ground 170 for resetting the latch 400. The reset transistor's 444 in each latch are controlled by a common GLOBAL line 460.

It should be appreciated that in yet a further type (not shown), the latch 400 could be set by connecting transistor 444 to the supply VDD 160.

Figure 7:
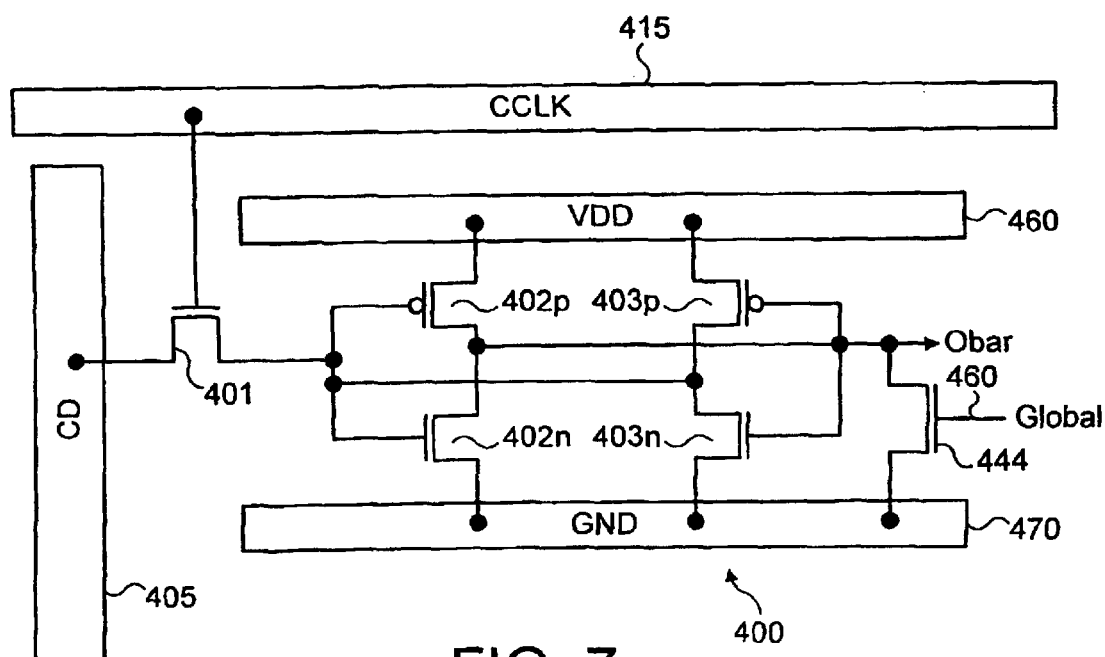
FIG. 7 shows a second type of physical template structure of the SRAM memory cell.

FIG. 7 shows the physical template for the memory cell 400 of the second type, in which the reset transistor is connected with the ground rail 170 and is controlled by a common GLOBAL signal 460.

Figure 8:
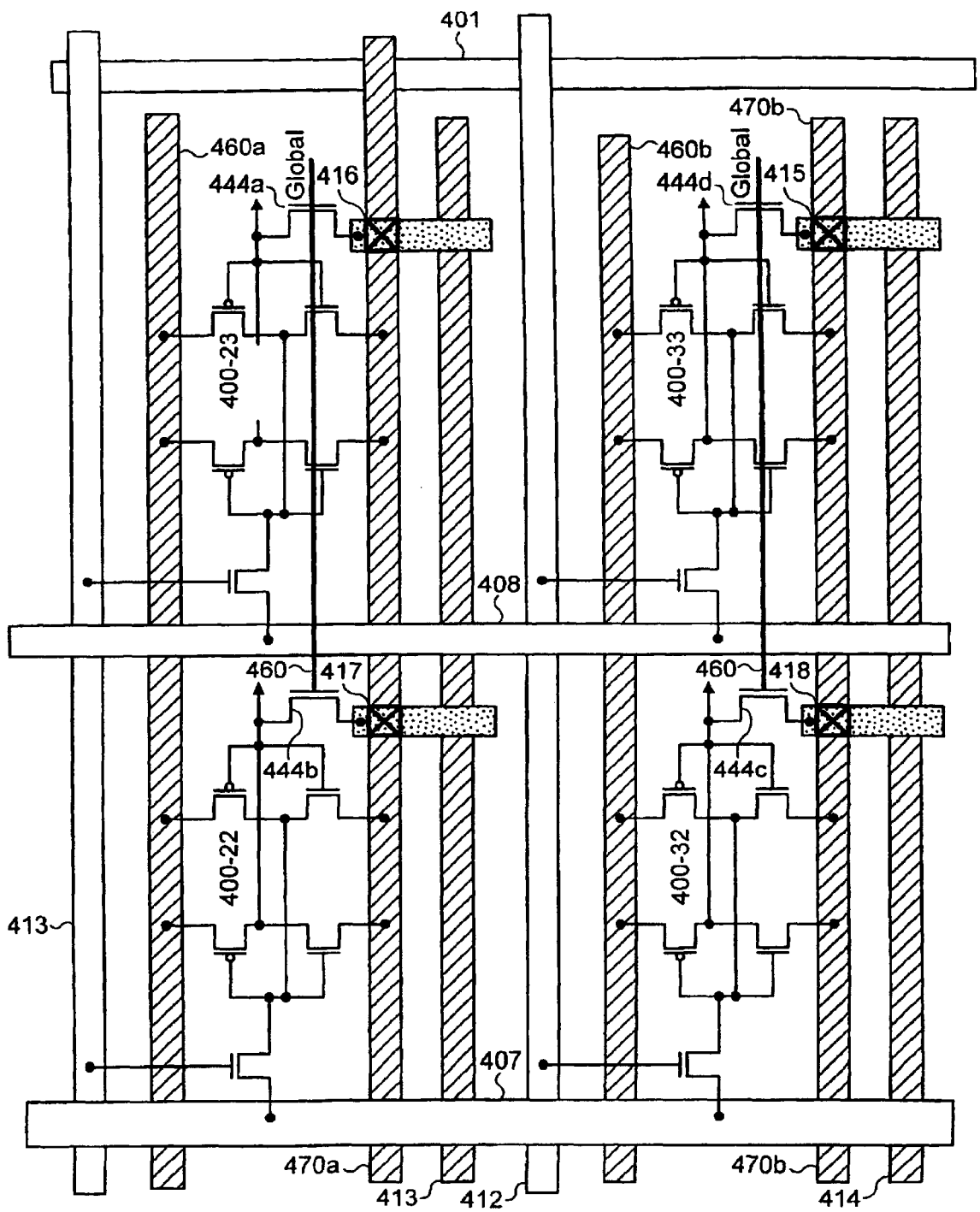
FIG. 8 shows a second type of SRAM cell array representing a step in manufacturing the hardened logic device according to the second embodiment of the invention.

FIG. 8 shows the physical template of a 2×2 memory cell array of the second type. The reset transistors 444a, 444b in memory cells 400-23, 400-22 respectively are connected with the ground rail 470a using the vias 416, 417 respectively. Also, the reset transistors 444c, 444d in memory cells 400-32, 400-33 respectively are connected with the ground rail 470b using the vias 418, 415 respectively. In normal working operation of the FPGA, when the common GLOBAL signal 460 goes high, all of the reset transistors 444 turn on which resets the memory cells.

Figure 9:
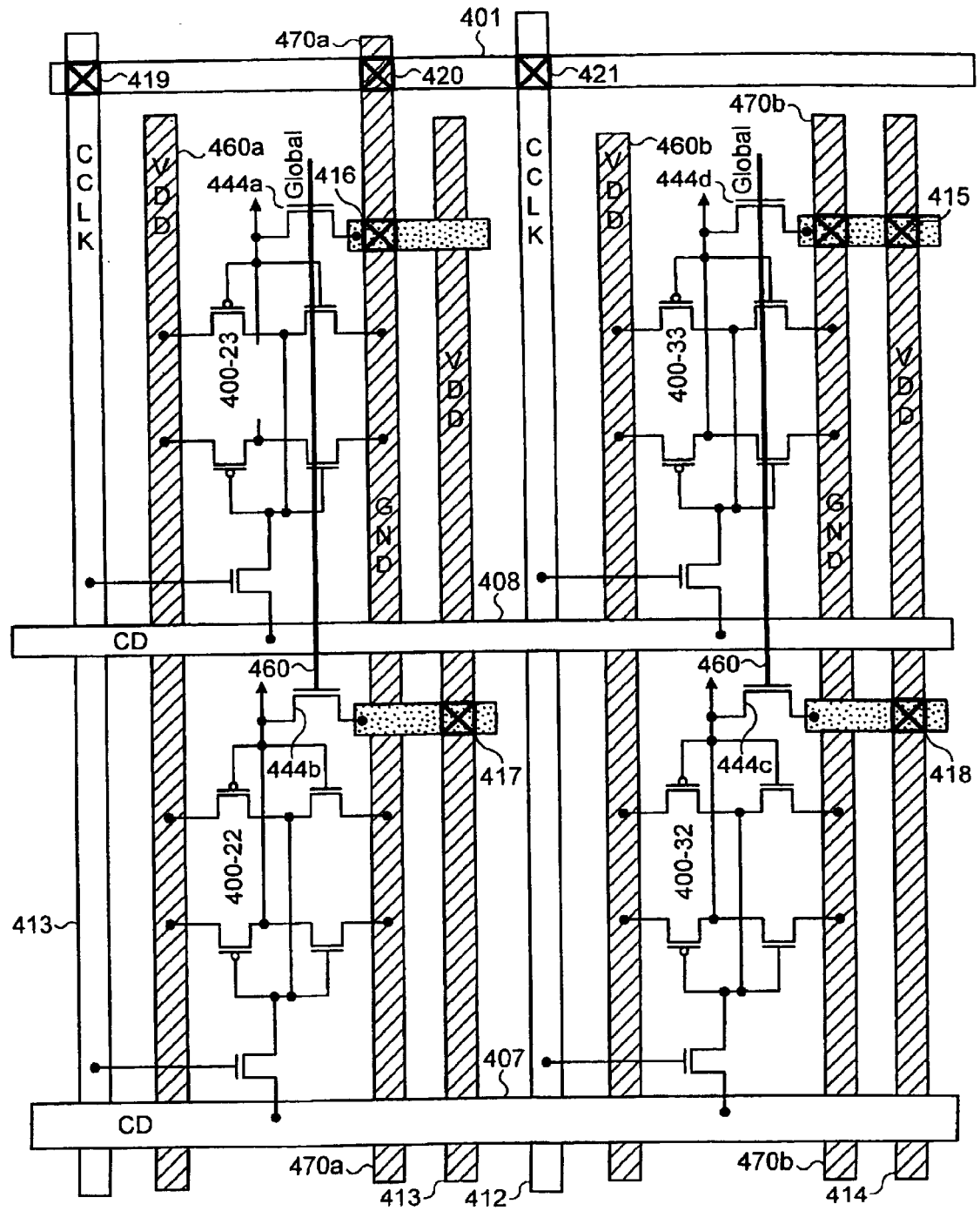
FIG. 9 shows a second type of SRAM cell array of the hardened logic device after configuration.

FIG. 9 shows a second embodiment of the present invention for hardening the FPGA of the programmable memory cell array using memory cells of the second type. This embodiment shows that in order to harden information, the reset transistors are switched to their desired setting. That is, depending on the specific data configuration bits, the reset transistors 444a–d can be connected using the via plane in metal layer N+1 (N−1)' to either the supply VDD or the ground rails so that the value of "1" or "0" is stored in the corresponding memory cell.

The via 416 is used to connect the reset transistor 444a of cell 400-23 with the ground GND line 470a in metal layer N to provide the "low" or "0" value to memory cell 100-23. The via 417 is used to connect the reset transistor 444b of cell 400-22 with the supply VDD rail 413 in metal layer N to provide the "high" or "1" value to memory cell 400-22. Also, the vias 418 and 415 are used to connect the reset transistors 444c and 444d of cell 400-32 and 400-33 with the supply VDD line 414 to provide "high" or "1" values to memory cells 400-32 and 400-33 respectively.

Therefore, when the common GLOBAL signal 460 goes high, the respective values will be loaded into the memory cells and if the GLOBAL signal 460 is permanently pulled-up by connecting it with a VDD line in hard form, then these values remain permanently stored in the memory cells.

Since the input pass transistors 401 are also connected with the memory cells, it is necessary to turn off these transistors to avoid any spurious signals on the common data lines 407 and 408 affecting the status of the stored values in the memory cells. Therefore, the common clock lines 412 and 413 in metal layer N are connected with each other using a further metal line 401 in metal layer N+1 (or N−1) using the vias 421 and 419 respectively or in an alternative embodiment using the same metal layer without any vias. Now all the clock lines are connected with each other and can be turned off at the same time. To turn off the input transistor permanently, the further line (connected to the common clock lines) is connected with the GND line 470a using the via 420. Now all the input pass transistors are off and no data can be loaded into the memory cells from the common data lines 407 and 408.

Therefore, once a specific configuration pattern is selected and tested for a FPGA, the memory cell array can be hardened to achieve the specific configuration functionality by using a simple hardening method, which does not need to re-designing an ASIC from scratch. Faster time to market product can be achieved using pre semi-fabricated FPGAs by changing only some physical templates (masks).

Thus, a volatile (SRAM) based FPGA can be converted into a hardened FPGA equivalent capable of performing a desired operation by selecting a set of configuration bits. Once the system requirement is fulfilled by a specific set of configuration data bits, then the volatile FPGA can be replaced by a hardened FPGA by permanently storing the configuration bits in the SRAM cells by making specific metal connections during the manufacturing process.

It should be appreciated that the embodiments described herein are merely examples of various ways of implementing the invention, however other embodiments that make use of other more complex array structures are equally applicable. For example, the array is described in two dimensions as having rows and columns, however arrays in 3 or more dimensions could also be envisaged.

It should be appreciated that the present invention provides a method for hardening PLD's (Programmable Logic Devices) and includes both designing and manufacturing the PLDs and also the finalization of the specific configuration with PLD and the manufacturing of the hardened PLDs.

Embodiments of the present invention have been described in relation to metal lines or layers, but it should be appreciated that alternative materials displaying uniform conductive properties could also be used, for example polycrystalline silicon.

What is claimed is:

1. A method of configuring a logic device having a plurality of memory cells connected by data lines and clock lines to form an array, the device having a further connecting line, the method comprising:

receiving data on said data lines for storing in each of the memory cells;

storing data in each of the memory cells by selectively enabling the clock lines;

testing the logic device until it is decided to store certain data in the memory cells;

hardening the array to fix the certain data in said memory cells; and permanently connecting the clock lines to the further connecting line, whereby all clock lines are selectable together after the logic device has been configured.

2. The method of claim 1, wherein the clock lines and further connecting line are permanently enabled.

3. The method of claim 1, wherein hardening of the data is achieved by selectively connecting said data lines to one of high and low power supply rails.

4. The method of claim 3, wherein the clock lines are permanently enabled using a via to connect at least one of the power rails to the further connecting line.

5. The method of claim 1, wherein the memory cells are arranged in rows and columns, wherein each row or column is formed by cells connected to a common data line and the other is formed by cells connected to a common clock line.

6. The method of claim 4, wherein for the hardening step, the common data lines are separated into disconnected portions associated with each memory cell.

7. The method according to claim 1, wherein the data, clock and further connecting lines are formed in respectively different metal layers.

8. The method according to claim 1, wherein the data, clock and further connecting lines are formed in the same metal layer but electrically separated from one another.

9. The method according to claim 7, wherein the step of hardening is performed using vias for connecting lines in said metal layers.

10. The method according to claim 1, wherein during manufacture of the logic device, space is reserved for said further connecting line.

11. A logic device having a plurality of memory cells forming an array, each memory cell comprising:
   a data line for transferring data through a pass element to a storage device arranged to store the data;
   a clock line for enabling the pass element;
   a further connecting line formed independently of said clock lines; and wherein said data is fixedly stored in the memory devices and whereby the clock lines are permanently connected to said further line so that the clock lines are selectable together.

12. The logic device according to claim 11, wherein each memory cell is connected to a set of power rails for supplying the storage device.

13. The logic device according to claim 12, wherein said array of memory cells are arranged in rows and columns, wherein each row or column is formed by cells connected to a common data line and the other is formed by cells connected to a common clock line.

14. The logic device according to claim 13, wherein said data is fixedly stored in the memory devices by selectively connecting said common data and said common clock lines to said further line and the power rails.

15. The logic device according to claim 12, wherein the power lines are selectively connected to the data lines.

16. The logic device according to claim 12, wherein the power lines are selectively connected to the further line.

17. The logic device according to claim 11, wherein lines are formed in respectively different metal layers and connected by vias.

18. A method of configuring a logic device having a plurality of memory cells forming an array connected by data lines and clock lines, the memory cells having a latch for storing data, a transistor and supply and reference voltages, the device having a further line, the method comprising:
   connecting the latch of each memory cell through said transistor to one of said supply and reference voltages;
   setting each latch to store data corresponding to one of said voltages by enabling said transistors using a common control signal; and
   when data is decided to be stored in the latches of said memory cells, hardening the array to fix the data by permanently connecting the clock lines to the further line.

19. A method according to claim 18, wherein said further line is connected to said reference voltage.

20. A logic device having a plurality of memory cells forming an array, each memory cell comprising:
   a data line for transferring data through a pass element to a latch arranged to store the data;
   a clock line for enabling the pass element;
   a transistor connected between said latch and one of a supply voltage and a reference voltage, the transistor being enabled by a control line; and
   a further line wherein said data is fixedly stored in the memory cells by connecting said clock line to said the further line.

21. A logic device according to claim 20, wherein said control line is common to all the memory cells of the device.

22. A logic device according to claim 21, wherein said common control line is connected to a voltage so that the transistors are permanently enabled.

23. A logic device according to claim 20, wherein said further line is connected to said reference voltage for disabling all of said pass elements.

* * * * *